US009141413B1

(12) United States Patent
Cruz-Campa et al.

(10) Patent No.: US 9,141,413 B1
(45) Date of Patent: Sep. 22, 2015

(54) OPTIMIZED MICROSYSTEMS-ENABLED PHOTOVOLTAICS

(71) Applicant: Sandia Corporation, Albuquerque, NM (US)

(72) Inventors: Jose Luis Cruz-Campa, Albuquerque, NM (US); Gregory N. Nielson, Albuquerque, NM (US); Ralph W. Young, Albuquerque, NM (US); Paul J. Resnick, Albuquerque, NM (US); Murat Okandan, Edgewood, NM (US); Vipin P. Gupta, Reno, NV (US)

(73) Assignee: Sandia Corporation, Albuquerque, NM (US)

( * ) Notice: Subject to any disclaimer, the term of this patent is extended or adjusted under 35 U.S.C. 154(b) by 444 days.

(21) Appl. No.: 13/633,970

(22) Filed: Oct. 3, 2012

Related U.S. Application Data

(63) Continuation-in-part of application No. 12/914,441, filed on Oct. 28, 2010, which is a continuation-in-part of application No. 11/933,458, filed on Nov. 1, 2007.

(60) Provisional application No. 61/565,369, filed on Nov. 30, 2011.

(51) Int. Cl.
*G06F 9/455* (2006.01)
*G06F 17/50* (2006.01)

(52) U.S. Cl.
CPC ............................ *G06F 9/455* (2013.01)

(58) Field of Classification Search
USPC ........................................................ 716/132
See application file for complete search history.

(56) References Cited

U.S. PATENT DOCUMENTS

| 4,273,594 | A * | 6/1981 | Heller et al. ................. 148/33.3 |
| 5,626,687 | A * | 5/1997 | Campbell ..................... 136/259 |
| 7,932,462 | B2 | 4/2011 | Van Riesen et al. |
| 8,067,295 | B2 | 11/2011 | Yagiura et al. |
| 8,093,492 | B2 | 1/2012 | Hering et al. |
| 2010/0116318 | A1 * | 5/2010 | Sumida et al. ................ 136/246 |
| 2011/0308565 | A1 | 12/2011 | Takayama et al. |
| 2012/0006483 | A1 | 1/2012 | Hanoka et al. |
| 2012/0031468 | A1 | 2/2012 | Boise et al. |
| 2012/0060890 | A1 | 3/2012 | Park et al. |
| 2012/0103388 | A1 | 5/2012 | Meakin et al. |
| 2012/0118358 | A1 | 5/2012 | Song |
| 2012/0122262 | A1 | 5/2012 | Kang et al. |

OTHER PUBLICATIONS

Cruz-Campa, J.L. et al., "Back-contacted and Small Form Factor GaAs Solar Cell", Jun. 20-25, 2010, Photovoltaic Specialists Conference (PVSC), 2010 35th IEEE, pp. 1248-1252.*

(Continued)

*Primary Examiner* — Paul Dinh
*Assistant Examiner* — Bryce Aisaka
(74) *Attorney, Agent, or Firm* — Martin I. Finston

(57) ABSTRACT

Technologies pertaining to designing microsystems-enabled photovoltaic (MEPV) cells are described herein. A first restriction for a first parameter of an MEPV cell is received. Subsequently, a selection of a second parameter of the MEPV cell is received. Values for a plurality of parameters of the MEPV cell are computed such that the MEPV cell is optimized with respect to the second parameter, wherein the values for the plurality of parameters are computed based at least in part upon the restriction for the first parameter.

7 Claims, 19 Drawing Sheets

(56) References Cited

OTHER PUBLICATIONS

Lentine, A.L. et al., "Optimal Cell Connections for Improved Shading, Reliability, and Spectral Performance of Microsystem Enabled Photovoltaic (MPEV) Modules", Jun. 20-25, 2010, Photovoltaic Specialists Conference (PVSC), 2010 35th IEEE , pp. 3048-3054.*

* cited by examiner

OPTIMIZED MICROSYSTEMS-ENABLED PHOTOVOLTAICS

RELATED APPLICATIONS

This application claims priority to U.S. Provisional Patent No. 61/565,369, filed on Nov. 30, 2011, and entitled "EFFICIENT SOLAR CELL". This application is also a continuation-in-part of U.S. patent application Ser. No. 12/914,441, filed on Oct. 28, 2010, which is a continuation-in-part of U.S. patent application Ser. No. 11/933,458, filed on Nov. 1, 2007. The entireties of such applications are incorporated herein by reference.

STATEMENT OF GOVERNMENTAL INTEREST

This invention was developed under Contract DE AC04-94AL85000 between Sandia Corporation and the U.S. Department of Energy. The U.S. Government has certain rights in this invention.

BACKGROUND

As concerns continue to mount with respect to carbon emissions associated with conventional electric power generation systems, continued research has been undertaken with respect to power generation systems that use renewable energy resources to generate electric power, such as solar power systems, wind power systems, geothermal power systems, and the like. With more particularity regarding solar cells, such solar cells are designed to convert at least a portion of available light into electric energy. Solar cells are generally based upon semi-conductor physics, wherein a solar cell comprises a P-N junction photodiode with a light sensitive area. The photovoltaic effect, which causes a solar cell to convert light directly into electric energy, occurs inside a semiconductor material where light knocks off electrons. Because of the structure of the cell, there is an induced field that causes electrons to flow in one direction and collect at the terminals. One common structure of the solar cell is based on a PN junction composed of two layers: a p-type semiconductor and an n-type semiconductor. The interface where the two join is referred to as a junction.

Cost to manufacture solar cells has reached a point where solar energy is beginning to become cost-competitive with conventional fossil-fuel burning systems.

SUMMARY

The following is a brief summary of subject matter that is described in greater detail herein. This summary is not intended to be limiting as to the scope of the claims.

Described herein are various technologies pertaining to optimizing at least one characteristic of a photovoltaic (PV) cell are described herein. In an exemplary embodiment, the PV cell can be a microsystem-enabled PV (MEPV) cell, which is constructed through utilization of semiconductor fabrication techniques, is flexible, has a size of approximately 2 mm or less in length and width, a thickness equal or less than 30 μm, and has all backside contacts. The characteristic of the device that is optimized can be any suitable characteristic, such as efficiency of the cell, carrier lifetime of at least one material included in the cell, resistance of the cell, size of the cell, amongst others.

A designer of the PV cell can set forth a restriction for at least one parameter of the PV cell, wherein such restriction can be based upon manufacturing restrictions, cost restrictions, material availability, or the like. For example, the designer can indicate that a particular layer, composed of a certain material, must have a set thickness. The designer of the PV cell can subsequently cause a computer-implemented algorithm to optimize efficiency of the PV cell while taking into account the restriction set forth by the designer. A PV cell of the design output by the computer-implemented algorithm can then be manufactured, with its efficiency optimized given the specified thickness constraint.

Other aspects will be appreciated upon reading and understanding the attached figures and description.

DETAILED DESCRIPTION

Figure 1:
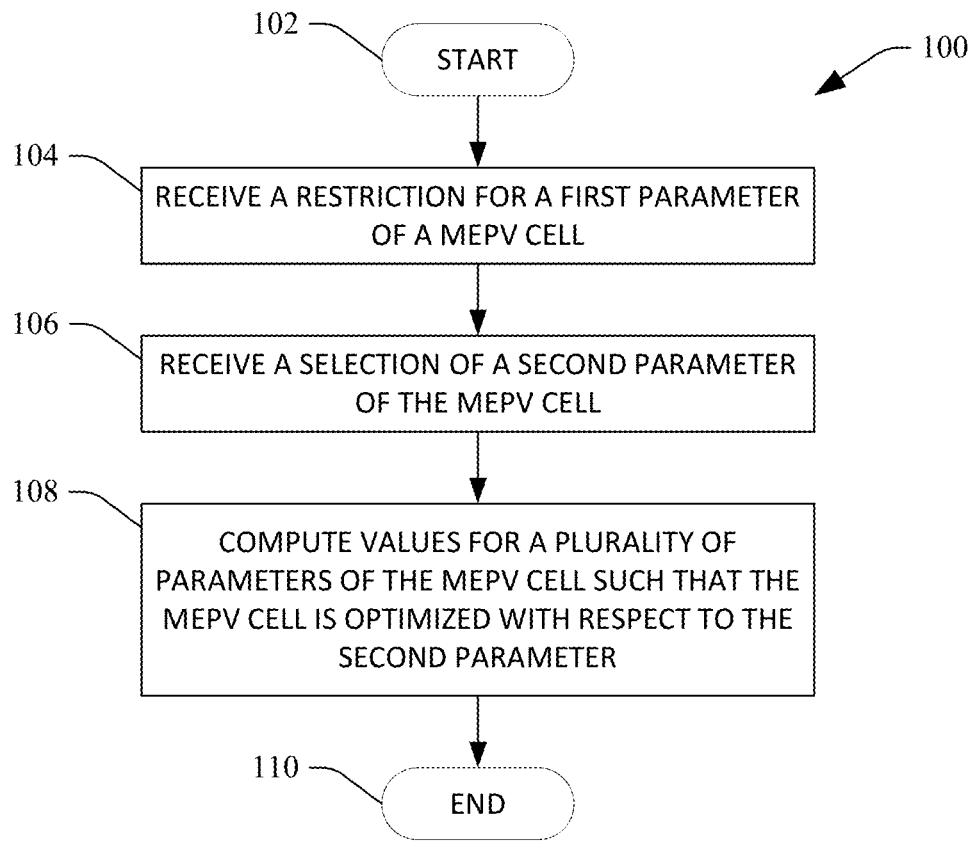
FIG. 1 is a flow diagram that illustrates an exemplary methodology for designing an MEPV cell.

Various technologies pertaining to Microsystems-Enabled Photovoltaic (MEPV) cells will now be described with reference to the drawings, where like reference numerals represent like elements throughout. In addition, several functional block diagrams of exemplary systems are illustrated and described herein for purposes of explanation; however, it is to be understood that functionality that is described as being carried out by certain system components may be performed by multiple components. Similarly, for instance, a component may be configured to perform functionality that is described as being carried out by multiple components. Additionally, as used herein, the term "exemplary" is intended to mean serving as an illustration or example of something, and is not intended to indicate a preference.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices.

With reference now to FIG. 1, an exemplary methodology is illustrated and described. While the methodology is described as being a series of acts that are performed in a sequence, it is to be understood that the methodology is not limited by the order of the sequence. For instance, some acts may occur in a different order than what is described herein. In addition, an act may occur concurrently with another act. Furthermore, in some instances, not all acts may be required to implement a methodology described herein.

Moreover, the acts described herein may be computer-executable instructions that can be implemented by one or more processors and/or stored on a computer-readable medium or media. The computer-executable instructions may include a routine, a sub-routine, programs, a thread of execution, and/or the like. Still further, results of acts of the methodologies may be stored in a computer-readable medium, displayed on a display device, and/or the like. The computer-readable medium may be any suitable computer-readable storage device, such as memory, hard drive, CD, DVD, flash drive, or the like. As used herein, the term "computer-readable medium" is not intended to encompass a propagated signal.

FIG. 1 illustrates an exemplary methodology 100 that facilitates designing a microsystem-enabled photovoltaic (MEPV) cell. As used herein, an MEPV cell can be a cell that is manufactured by way of microsystem tools, such as those utilized in semiconductor fabrication. Accordingly, the MEPV cell can be relatively small, on the order of 2 mm in diameter, and less than 50 μm in thickness. Furthermore, the MEPV cell can have all backside contacts. For instance, the following references, which are incorporated herein by reference, describe the building of photovoltaic modules that comprise numerous photovoltaic cells using microfabrication techniques: Nielson, et al., "Microscale C-SI (C) PV Cells for Low-Cost Power", 34th IEEE Photovoltaic Specialist Conference, Jun. 7-10, 2009, Philadelphia, Pa., 978-1-4244-2950/90, and Nielson, et al., "Microscale PV Cells for Concentrated PV Applications," 24th European Photovoltaic Solar Energy Conference, Sep. 21-25, 2009, Hamburg, Germany 3-936338-25-6. In summary, such references described one sun and concentrating systems with integrated micro-optical lenses, and further describe relatively thin cells that have been fabricated using epitaxial lift-off in Silicon (Si) and Gallium Arsenide (GaAs) with efficiencies exceeding 10%.

The methodology 100 starts at 102, and at 104 a restriction on a first parameter of an MEPV cell is received. The term parameter is intended to encompass values that are indicative of physical properties and/or operation of the MEPV cell. For example, spacing between contacts of the MEPV cell is a parameter of the MEPV cell, as it refers to a physical property of the cell. Likewise, the efficiency of the MEPV cell refers to operation of the MEPV cell, and is therefore also to be considered a parameter of the MEPV cell Other exemplary parameters include, but are not limited to, carrier lifetime of the MEPV cell, resistance of the MEPV cell, carrier lifetime duration of a material in the MEPV cell, size of the MEPV cell or a particular portion therein, amount of dopant included in a portion of the MEPV cell, an amount of energy producible by the MEPV cell, a ratio between species for an implant profile of the MEPV cell, size of contacts of the MEPV cell, separation between contacts of the MEPV cell, thickness of a substrate of the MEPV cell, magnitude of surface recombination velocity in the MEPV cell, light concentration of the MEPV cell, open circuit voltage of the MEPV cell, short-circuit current of the MEPV cell, materials cost of the MEPV cell, amongst others. It is also to be understood that, in some cases, a parameter may depend upon another parameter; e.g., cell efficiency can depend upon cell size, size of contacts, etc.

A parameter can be restricted in any suitable manner; for example, a designer of an MEPV cell can set forth an absolute value or inequality as a restriction (e.g., cell diameter is to be 2 mm). In other embodiments, the designer of the MEPV cell can set forth a range (e.g., cell diameter is to be between 2 mm and 4 mm). In still other embodiments, a restriction can be a relative restriction (e.g., thickness of the substrate is to be greater than thickness of the p-type semiconductor layer in the MEPV cell). In still other embodiments, a restriction can be some combination of these restrictions. At 106, a selection of a second parameter is received, wherein the designer of the MEPV cell desirably optimizes the MEPV cell with respect to the second parameter. The second parameter can be any suitable parameter of the MEPV cell, including those listed above. Accordingly, for example, the designer may indicate that, due to constraints imposed by manufacturing limitations, contacts of the MEPV cell must be spaced by 50 μm. The designer can input such restriction, and indicate that cell efficiency is desirably optimized considering such restriction.

At 108, values are computed for a plurality of parameters of the MEPV cell such that the MEPV cell is optimized with respect to the second parameter. The values are computed based at least in part upon the restriction for the first parameter of the MEPV cell. For example, if designer indicates that the spacing between contacts is restricted to be <50 μm (restriction on the first parameter), and the second parameter is cell efficiency, then at 108, a plurality of values for respective parameters of the MEPV cell (such as those set forth above) that optimize the MEPV cell with a contact spacing of <50 μm are computed. It is to be understood that multiple restrictions for multiple parameters of the MEPV cell can be received, and that values for other parameters not subject to restriction can be computed to optimize the MEPV cell with respect to the second parameter. The methodology completes at 110.

Figure 2:
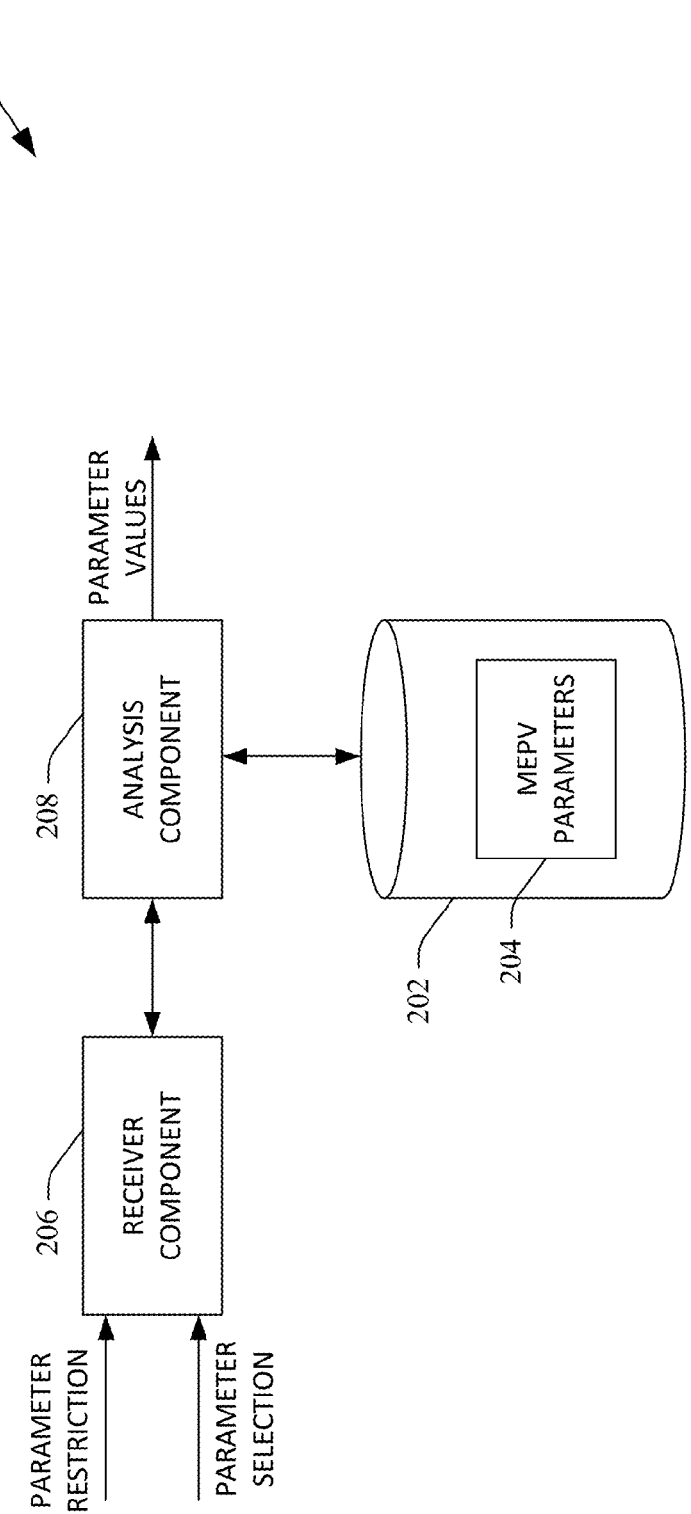
FIG. 2 is a functional block diagram of an exemplary system that facilitates designing an MEPV cell.

Referring now to FIG. 2, an exemplary system 200 that facilitates designing a MEPV cell is illustrated. The system 200 comprises a data repository 202 that includes a plurality of selectable parameters 204 of an MEPV cell. For instance, upon accessing the system 200, a designer can be provided with the parameters 204 in list form on a display screen of a graphical user interface. The system 200 further comprises a receiver component 206 that receives a restriction on a first parameter of a MEPV cell (e.g., selected from the MEPV parameters 204 by the designer). The receiver component 206 also receives a selection of a second parameter of the MEPV cell, wherein the MEPV cell is desirably optimized with respect to the second parameter. An analysis component 208 is in communication with the receiver component 206, and computes respective values for parameters of the MEPV cell other than the first parameter and the second parameter, wherein such values are computed to optimize the MEPV cell with respect to the second parameter. The analysis component computes the values such that any restrictions imposed by the designer are not violated, and such that the MEPV cell is optimized with respect to the second parameter. Pursuant to an example, the analysis component 208 can compute the respective values for the plurality of parameters using learned dependencies between the parameters in the MEPV parameters 204. Exemplary dependencies between parameters are set forth below.

Figure 3:
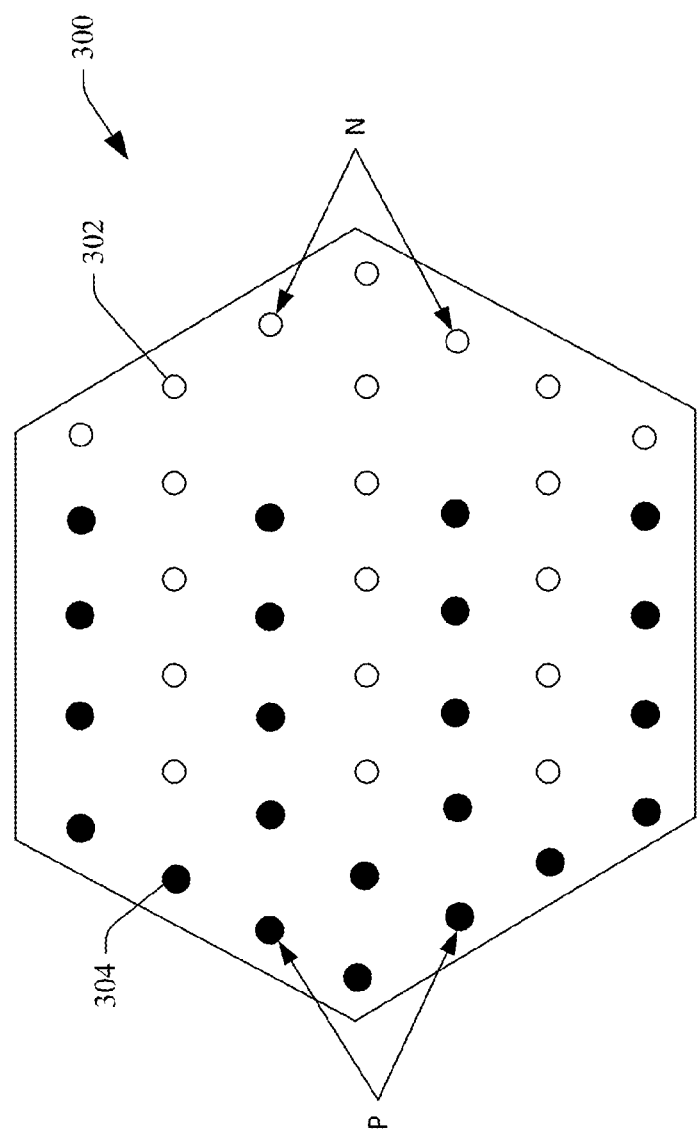
FIG. 3 is an overhead view of a substrate of an exemplary MEPV cell prior to being contacted.

Referring now to FIG. 3, a view of a substrate layer 300 of an MEPV cell prior to being contacted is illustrated. The substrate layer 300 comprises n-type regions (collectively shown by reference numeral 302) and p-type regions (collectively shown by reference numeral 304) implanted into the substrate layer 300. The implanted n-type regions 302 have a first size, a first dosage, (e.g., an amount of material implanted during implantation defined as the integral over time of an implantation ion current), and a first energy. Similarly, the p-type regions 304 have a second size, a second dosage, and a second energy. These sizes and dosages can define a percentage of the substrate layer surface 300 that contains implanted material. The sizes, dosages, ratios between sizes, percentage of the substrate layer 300 covered by implanted materials, etc., can be included in the MEPV parameters 204.

Additionally, the substrate layer 300 may be composed of various different types of materials, wherein each material can be associated with a carrier lifetime, a resistance, and a surface recombination velocity (SRV), which additionally can be included in the MEPV parameters 204.

Figure 4:
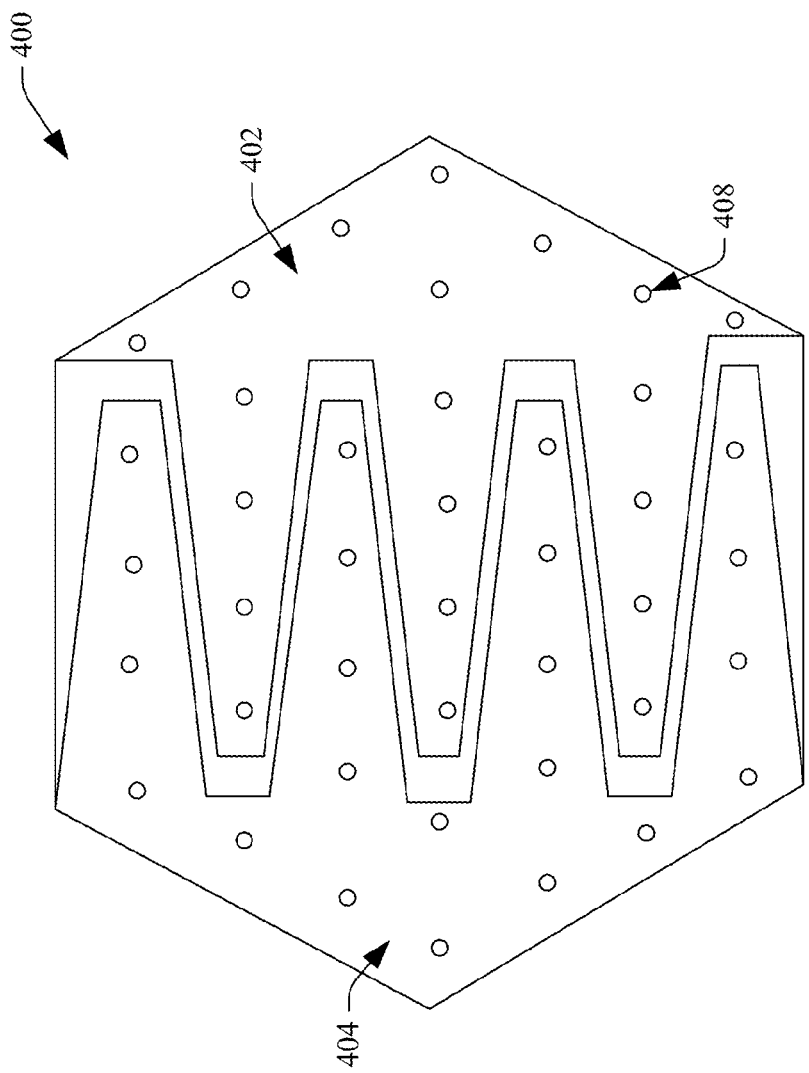
FIG. 4 is a front view of exemplary contacts of an MEPV cell.

Referring now to FIG. 4, a front-view of a contact layer 400 of an exemplary MEPV cell is illustrated. The contact layer 400 comprises an n contact 402 and a p contact 404. The contacts 402 and 404 can be composed of a conductive metal. Further, the n and p contacts 402 and 404 can be of an interdigitated structure, such that the contacts comprise a series of alternating fingers or tines, although it should be understood that other structures are contemplated. Parameters of the contact layer 400 that can be included in the MEPV parameters 204 include resistance, which can be impacted by the structure of the contacts 402 and 404. For example, thickening of ends of the fingers 406 may reduce the resistance of the metal contacts 400; accordingly, thickness of the fingers 406 can also be a parameter included in the MEPV parameters 204.

Each contact 402 and 404 comprises a plurality of contact points, collectively shown by reference numeral 408. The contact points 408 have a particular size (e.g., diameter) and spacing (e.g., distance between another contact point). It can be recognized that the contact spacing is correlated to the spacing of the n-type and p-type regions 302 and 304 depicted in FIG. 3, such that when the contact layer 400 is installed onto the substrate layer 300, the contact points 408 are in contact with the n-type and p-type regions 302 and 304. The contact points, when in such contact, can be described by a contact coverage percent of the semiconductor material. The n contact 402 and p contact 404 are separated by a contact separation distance. It can therefore be ascertained that contact point size, spacing, contact coverage percentage, and contact separation distance can be included in the MEPV parameters 204.

Figure 5:
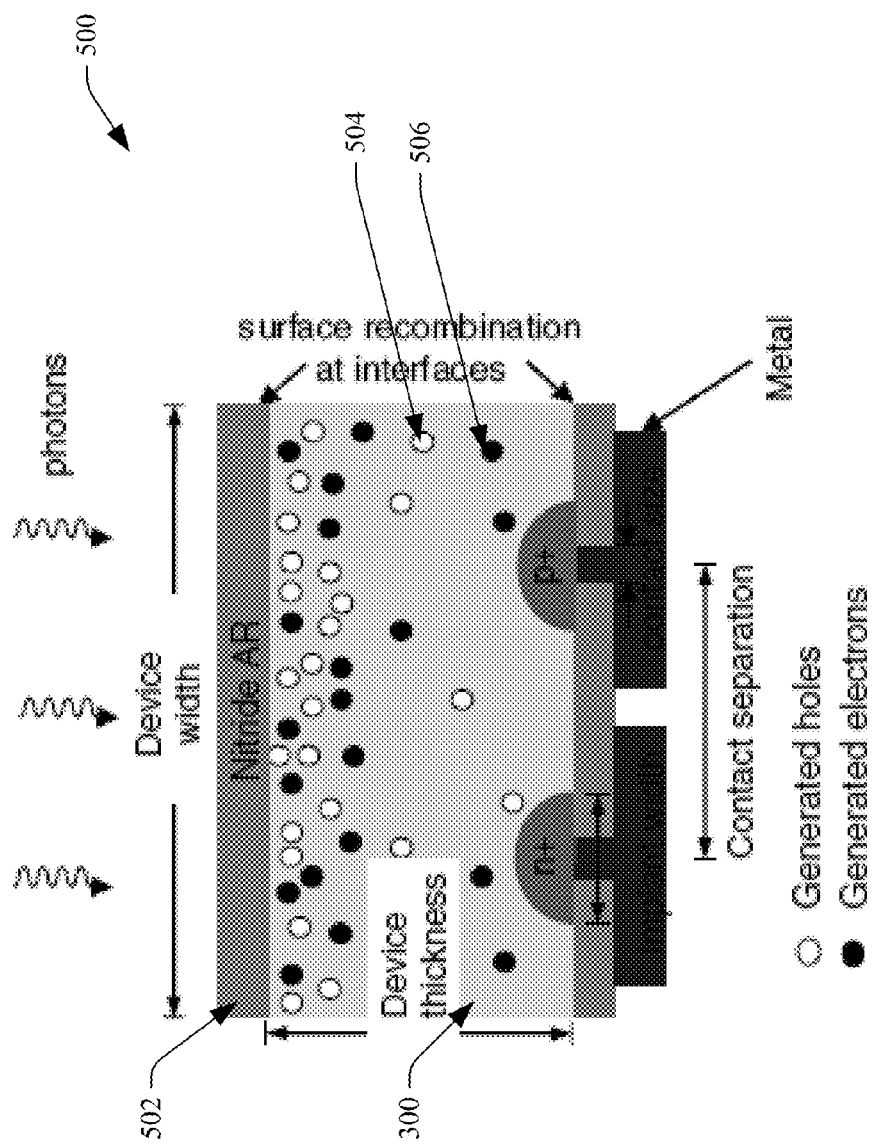
FIG. 5 is a cross-sectional view of an exemplary MEPV cell.

Referring now to FIG. 5, a cross-sectional view of an exemplary MEPV cell 500 is illustrated. The MEPV cell 500 has a certain diameter and comprises the substrate layer 300, wherein the substrate layer 300 has a particular thickness. The MEPC cell 500 can further comprise an antireflective coating 502. When exposed to light, photons are absorbed into the MEPV cell 500 through the antireflective coating 502. The antireflective coating 502 is employable to reduce reflection of incident light, and may also be employable to reduce surface recombination velocity. The absorbed photons generate free holes or positive charge carriers (collectively shown by reference numeral 504) and electrons or negative charge carriers (collectively shown by reference numeral 506). The holes 504 can be collected at the p contact 402, and electrons 506 can be collected at the n contact 404. The collected holes 504 and electrons 506 create a current and a voltage between the contacts 402 and 404, which may be extracted from the MEPV cell 500.

After initial testing of prototype MEPV cells, it was determined that MEPV cells are affected differently by a plurality of parameters than traditional PV cells. This differing behavior may be due at least in part to the sizes of components and materials, the 3-dimensional structure of the cell versus the traditional 1-dimensional stacked PV cell, and other factors.

Although parameters of MEPV cells may be complexly interrelated with one another, optimization of a parameter through the techniques described above is particularly beneficial in connection with enhancing efficiency of MEPV cells, for example. Described below are learned interdependencies between parameters that can be taken into consideration when optimizing an MEPV cell with respect to a selected parameter.

EXAMPLES

Influence of Wafer Resistance

Simulations of back-contacted solar cells with a constant material SRH lifetime showed no change in performance if the material resistance varied. This was found to be true for both small (2 μm) and large (200 μm) separation between contacts. The wafers used for the first cells fabricated a test group had a resistance of 20-30 Ω/cm. Larger separation between contacts where resistance may play a more important role were not explored.

Influence of SRH Lifetime

Simulations were run to observe the influence of SRH lifetime on cell performance. Device widths of 4 and 400 μm with a thickness of 20 μm were used for the simulations. The implant widths were 0.5 μm and the contact sizes were 0.25 μm, separated by 2 μm for the first device and 200 μm for the second device. Implantations of boron (energy=45 keV) and phosphorus (energy=120 keV) were created with a dose of $1 \times 10^{15}$ cm$^{-2}$, tilt of 7 degrees, and range of 0.15 μm for both dopants. A patterned 2.2-μm-thick photoresist was used to selectively mask the implantations. A drive-in step was performed for 30 minutes at 900 degrees C. in a nitrogen ($N_2$) atmosphere. SRH lifetimes of 5 ms, 0.5 ms, 5 μs, and 0.5 μs were plotted.

Figure 6:
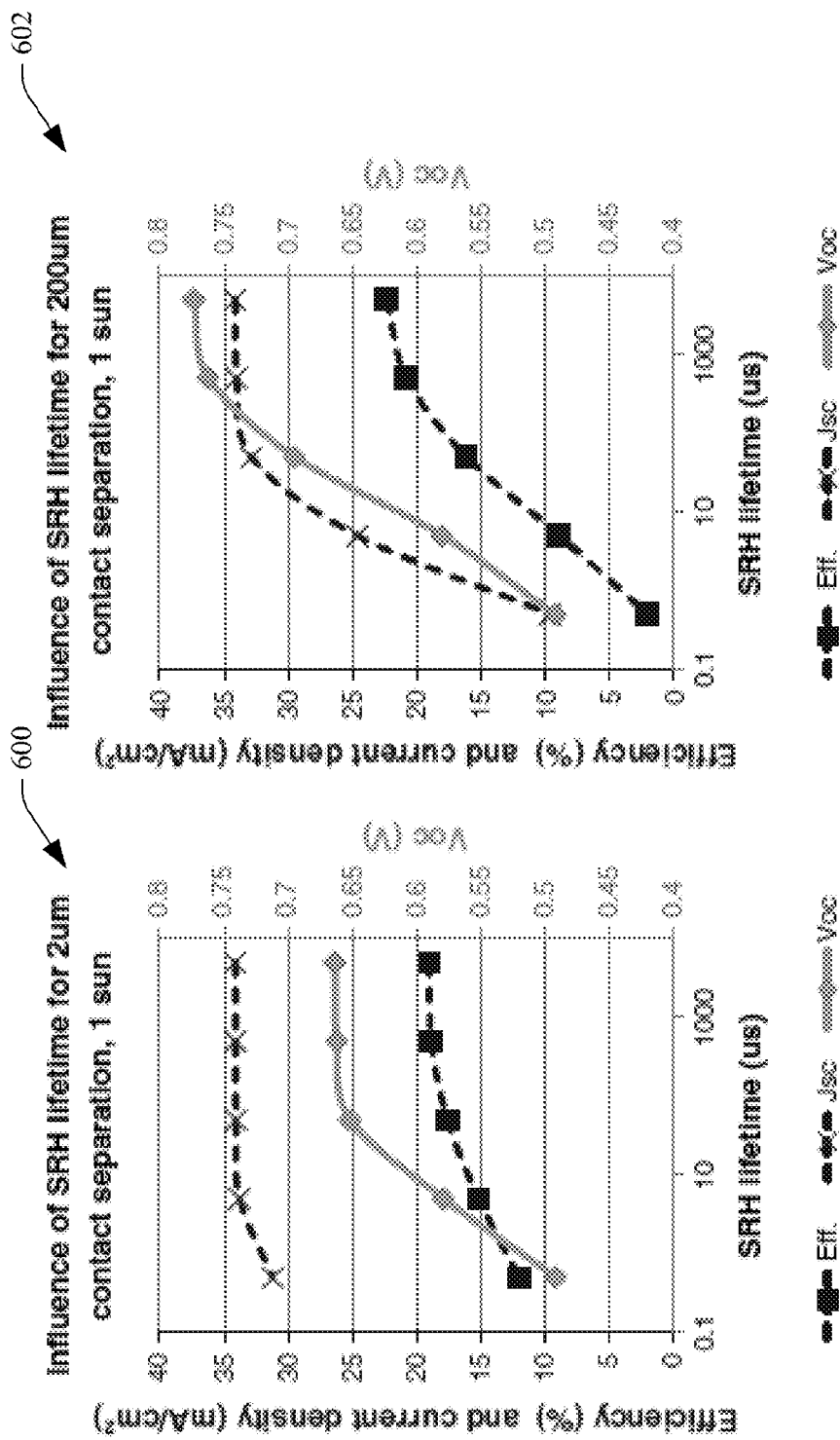
FIG. 6 is a set of graphs depicting influence of carrier lifetime on various parameters of an MEPV cell.

With reference to FIG. 6, graphs 600 and 602 illustrate efficiency in percentage, current density in mA/cm$^2$, and open circuit voltage ($V_{oc}$) in volts versus the SRH lifetime for two different cases, respectively: a device with contact separation of 2 μm (graph 600) and another with a contact separation of 200 μm (graph 602). The graphs 600 and 602 illustrate that higher lifetimes are preferred over lower lifetimes. For higher lifetimes, a larger separation was preferred but for low quality wafers (lifetime<50 μs), a smaller separation between collection electrodes achieved higher efficiencies. Therefore, low quality wafers (inexpensive substrates) can be used to create highly efficient cells if the contacts are close together.

Influence of Contact Separation

FIG. 6 illustrates that an interdependence exists between lifetime and separation between contacts. In the simulations, the influence of contact distance was investigated for two qualities of material (two lifetimes). Device widths of 6, 20, 60, 200, and 600 μm with electrode separations of 3, 10, 30, 100, and 300 μm, respectively, were simulated using a 20 μm thick device. The implant types, doses, energies, device width, and contact sizes were the same as those used to generate the graphs 600 and 602.

Figure 7:
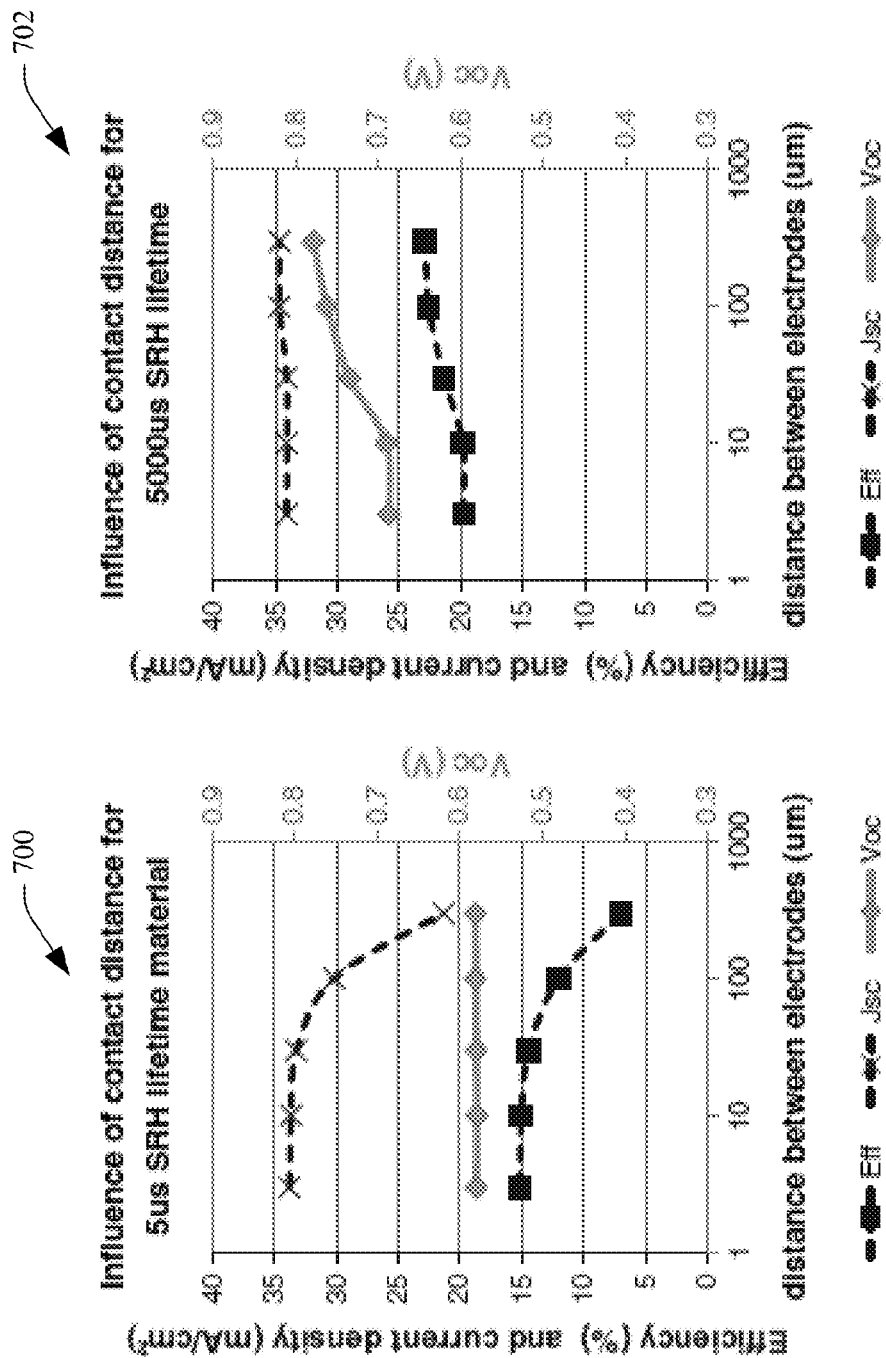
FIG. 7 is a set of graphs depicting influence of contact separation distance on various parameters of an MEPV cell.

Referring now to FIG. 7, graphs 700 and 702 illustrating the influence of contact distance and SRH lifetime on efficiency, current density, and open circuit voltage are illustrated. In FIG. 7, two tendencies can be observed. Efficiency decreased as the distance between electrodes increased for low lifetime materials (this showed the efficacy of using close contacts). However, high quality materials expressed the opposite occurrence: the efficiency increased as the distance between electrodes increased. This can be explained as follows: for low quality materials, contacts must be close together so carriers do not recombine on their way to collection points. If the contacts are close together, more carriers can be collected and higher currents can be achieved. For high quality materials, the carriers will have a long time to find the collection areas before they combine. As the distance between the electrodes increased, the percentage of area with implantations and contacts decreased. Because these areas represent high recombination sites, higher $V_{oc}$s and efficiencies are obtained as the distance between contacts was increased when using high quality wafers.

Influence of Implantation Size

FIG. 7 illustrated higher voltages when using a larger distance between electrodes due to a reduced percentage of implanted area when using high lifetime materials. In the following simulations, the influence of implanted area (presented as percent of back coverage) was investigated for two surface passivation qualities. Surface recombination velocity (SRV) expresses the quality of the surface passivation (slower velocities indicate enhanced passivation). For this simulation, a device 400 μm wide with a contact separation of 200 μm was used on a 20 μm thick layer. SRV numbers of 0 and 2000 cm s$^{-1}$ were used for a high quality material with a SRH lifetime of 5 ms. The implant types, doses, energies, and contact sizes were the same as the ones used to generate the graphs 600 and 602. For the simulations, the percentage of the back area covered with implantations varied. The percentage covered values were 98%, 30%, 10%, 5%, 2%, 1%, 0.5%, and 0.25% for the cell with zero surface recombination, and values of 98%, 75%, 50%, 30%, 10%, 1%, and 0.25% for the cell with high surface recombination.

Figure 8:
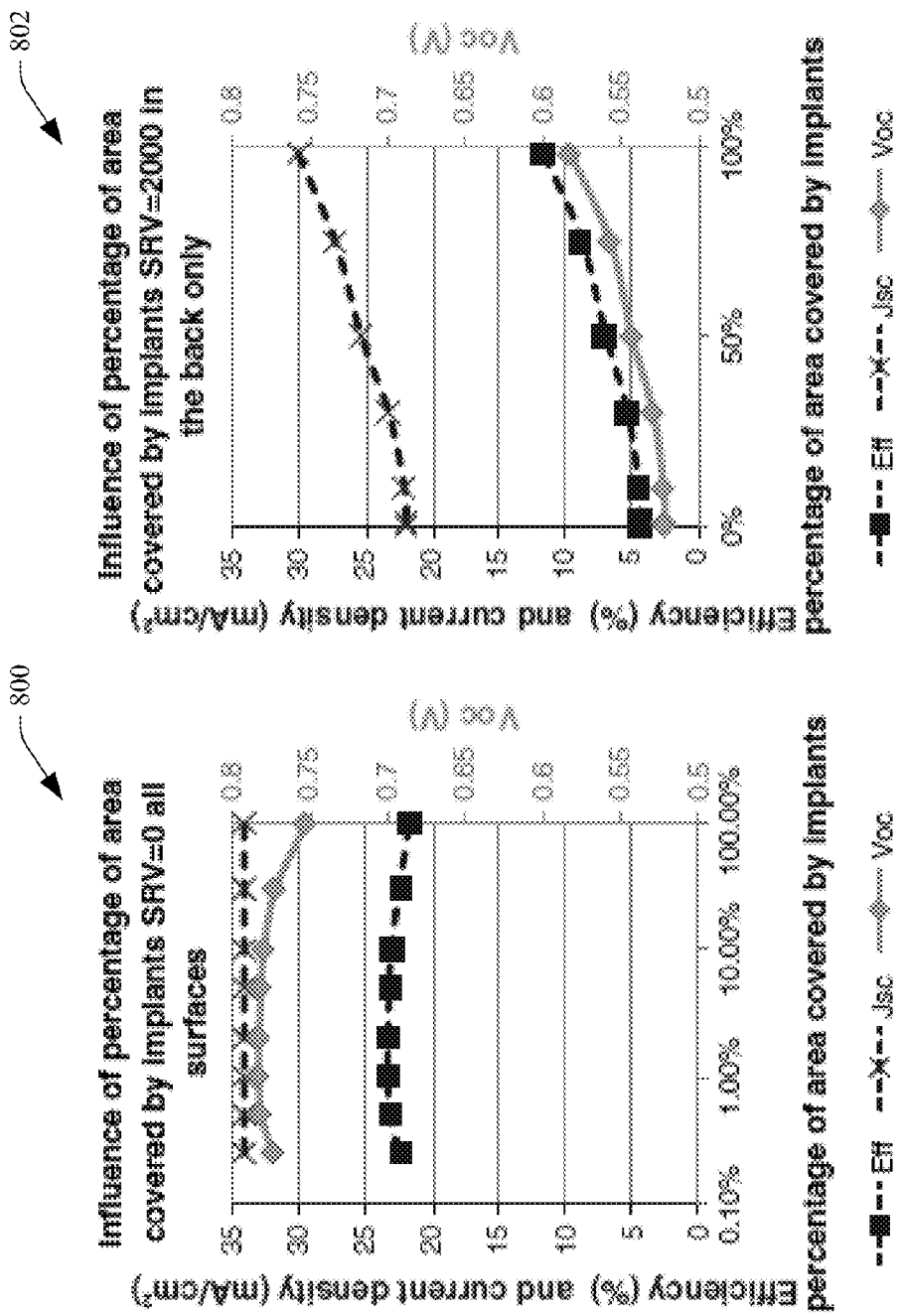
FIG. 8 is a set of graphs depicting influence of implanted coverage percentage on various parameters of an MEPV cell.

With reference now to FIG. 8, graphs 800 and 802 illustrating influence of percentage of area covered by implants for different SRV values and different implant locations is illustrated. These graphs 800 and 802 depict two noteworthy results: when excellent surface passivation (SRV=0) was present, the current density was independent of the percentage of area covered with implants. However, when using a poorly passivated cell (high SRV), current density was increased as the percentage of area covered with implants was augmented. The higher coverage of implantations produces passivation by fields on the back of the cell. Thus, $V_{oc}$ and efficiency are peaked at the maximum coverage of 98% when using poorly passivated substrates. On the other hand, $V_{oc}$, and efficiency for high quality surface passivation have a small dependence on the amount of back area implants. In this case, efficiency was found to be maximized when using 1% back coverage.

Influence on Contact Size

A point contact solar cell type was analyzed. A point contact solar cell has metal that only touches the semiconductor at small areas. In a simulation, the influence of contact area (%) on efficiency, current density, and open-circuit voltage was investigated. For the simulation, a device 400 μm wide with a contact separation of 200 μm was used on a 20 μm thick device. SRV numbers were set to 0 cm s$^{-1}$. The implant types, doses, and energies were the same as those used to generate the graphs 600 and 602. The implantation area was kept to 98% and was split in half between the two dopants. The percentage of the contacted back area varied. Percent values included 98%, 10%, 1%, and 0.13%.

Figure 9:
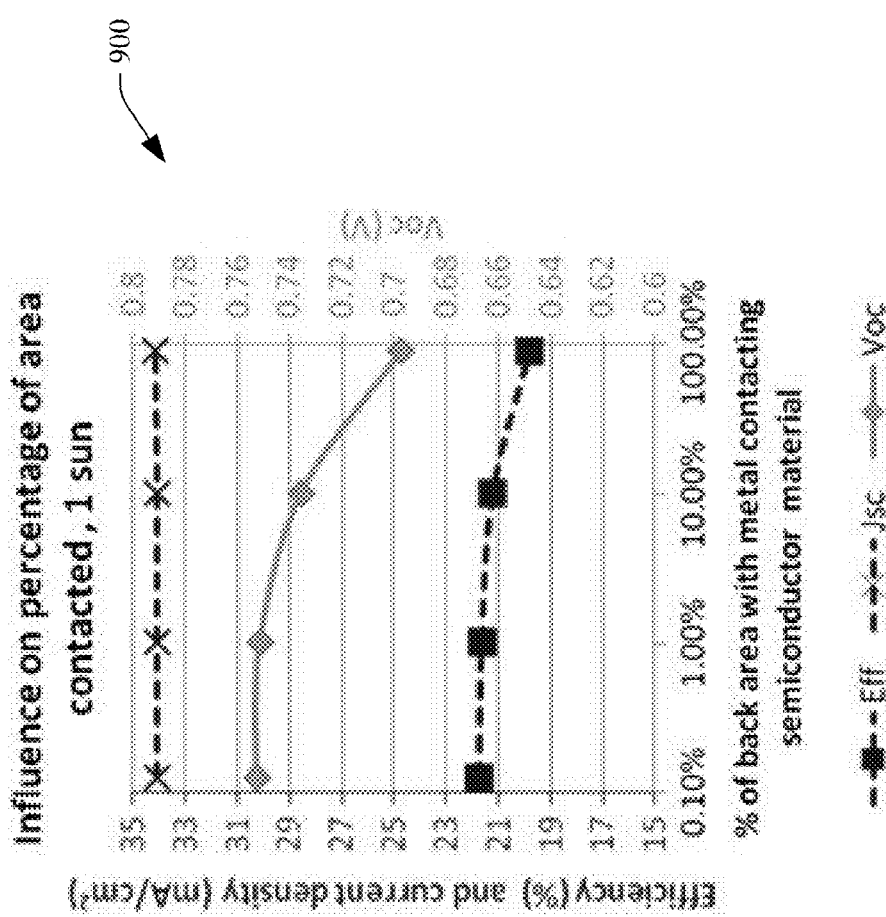
FIG. 9 is a graph of influence of percentage of area contacted on various parameters of an MEPV cell.

With reference now to FIG. 9, a graph 900 illustrating influence of percentage of area contacted with respect to efficiency, current density, and open circuit voltage of a MEPV cell is illustrated. Although the collected current is shown to remain consistent with the percentages, the 900 reveals that the open-circuit voltage was influenced by the percentage of area being contacted. $V_{oc}$ and efficiency are shown to be maximized when using smaller contacts. Furthermore, there may be an enhanced maximization effect in current due to enhanced back reflection. Metal-insulator interfaces are more reflective than metal-semiconductor interfaces, whereas the model is considered a perfect reflector for both cases.

Influence on Ratio of Two Implantations

As noted above, size of the implanted back area can have an influence on the performance of the solar cell. In simulations undertaken, the effect of the ratio of dopants in the implantation on the cell performance is shown. The ratio between dopants was altered while keeping the percentage coverage fixed to 48%. In this case, a 400 μm wide unit cell with a contact separation of 200 μm and thickness of 20 μm was used. The implant types, doses, and energies were the same as those used to generate the graphs 600 and 602. The ratios between p/n dopants were varied and took values of 95, 20.33, 4.18, 1, 0.24, 0.049, and 0.01.

An inverse effect on efficiency was found when SRV=0 compared with when SRV=2000. When SRV=0, the efficiency was increased because of an increased base size (p+-doped on a p-substrate). When, however, SRV=2000, the effect was the opposite: the efficiency was decreased when a smaller base was used.

Figure 10:
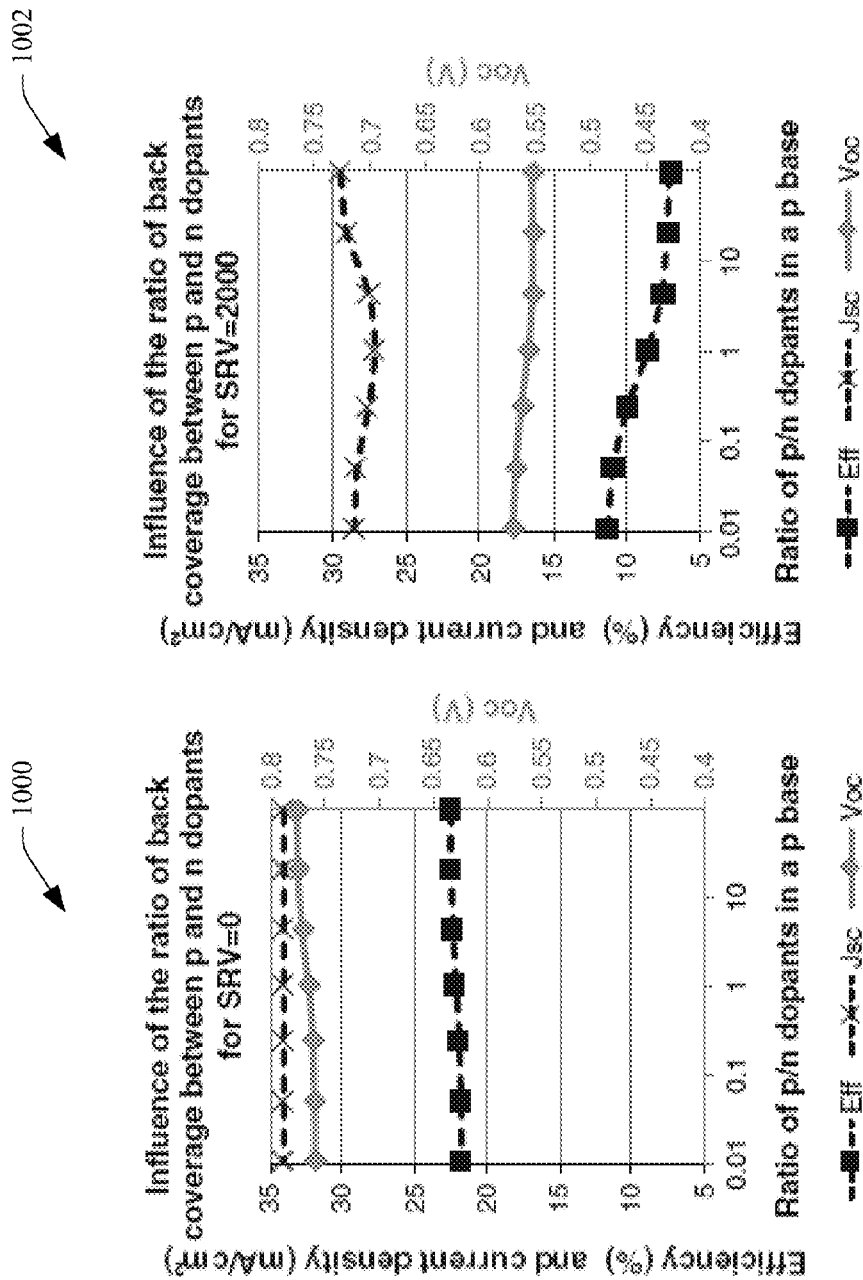
FIG. 10 is a set of graphs depicting influence of implantation ratio on various parameters of an MEPV cell.

With reference to FIG. 10, graphs 1000 and 1002 generally illustrating influence of ratio of back coverage between p and n dopants for different SRVs with respect to efficiency, current density, and open circuit voltage are illustrated.

Influence of the Dose and Depth of the Implantation

Solar cell performance also depends on the junction design. For simulations undertaken, the junction design was optimized by changing the implant dose and the energy of the implanted dopants. A 4 μm wide device with a contact separation of 2 μm and a thickness of 20 μm was used. The implantation width was 0.5 μm and the contact size was 0.25 μm. Two cases were analyzed: one with fixed energy and variable dose and another with fixed dose and variable energy. For the first case, the energy was fixed at 45 keV and the dose was changed from $10^{12}$ cm$^{-2}$ to $10^{16}$ cm$^{-2}$ in variations of one order of magnitude. For the second case, the dose was fixed at $10^{16}$ cm$^{-2}$ and the energy had values of 10, 30, 70, 95, and 120 keV.

Figure 11:
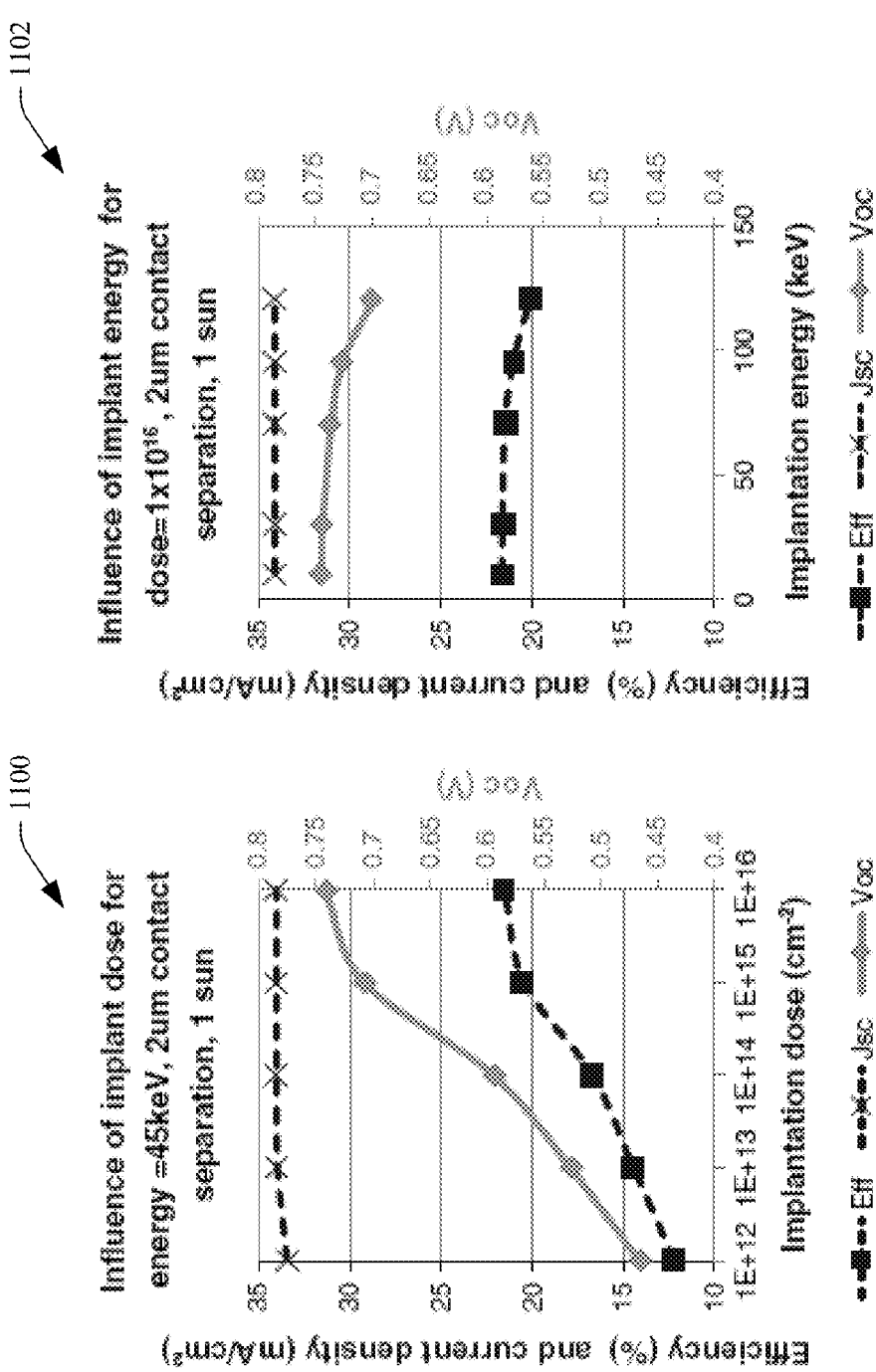
FIG. 11 is a set of graphs illustrating influence of implant does and energy on various parameters of an MEPV cell.

Turning to FIG. 11, graphs 1100 and 1102 illustrating influence of implant dose and implant energy with respect to efficiency, current density, and open circuit voltage are shown. FIG. 11 reveals that current, voltage, and efficiency were increased as the dose increased (graph 1100). FIG. 11 also reveals that the voltage and the efficiency dropped when the energy of the implant was increased (graph 1102).

In a first simulation, as the implantation dose was increased, an increased bending of the bands toward the contacts was created. The bending of the conduction and valence band acts as a barrier for one type of carrier while becoming an easy path for the other type of carrier. Therefore, bent bands reduce recombination in the doped regions by blocking one type of carrier. Through this process, the voltage and efficiency are increased. Also, a strong bending close to the metallization improves the ohmic contact. For the second simulation, as the energy of the implantation was increased, the peak of the doping was farther away from the interface (e.g., the dopants were more deeply implanted into the semiconductor), which caused a less effective ohmic contact. Higher energies also increased the volume of the highly doped silicon, which is a high recombination site.

Influence of Substrate Thickness

It is known that silicon is an indirect semiconductor and that the absorbance for these materials is significantly smaller than for direct semiconductors. Simulations were undertaken to ascertain influence of substrate thickness on the solar cell performance for two wafer qualities (two SRH lifetimes). For these simulations, a 42-mm-wide device with a contact separation of 21 mm was used. The implantation width is 8 μm and the contact size is 3 μm. The implant energies were 45 keV for boron and 120 keV for phosphorus with a dose of $1\times10^{15}$ $cm^{-2}$ for the dopants. The thickness of the substrate was varied with values 1, 3, 10, 30, 100, 300, and 1000 μm.

Figure 12:
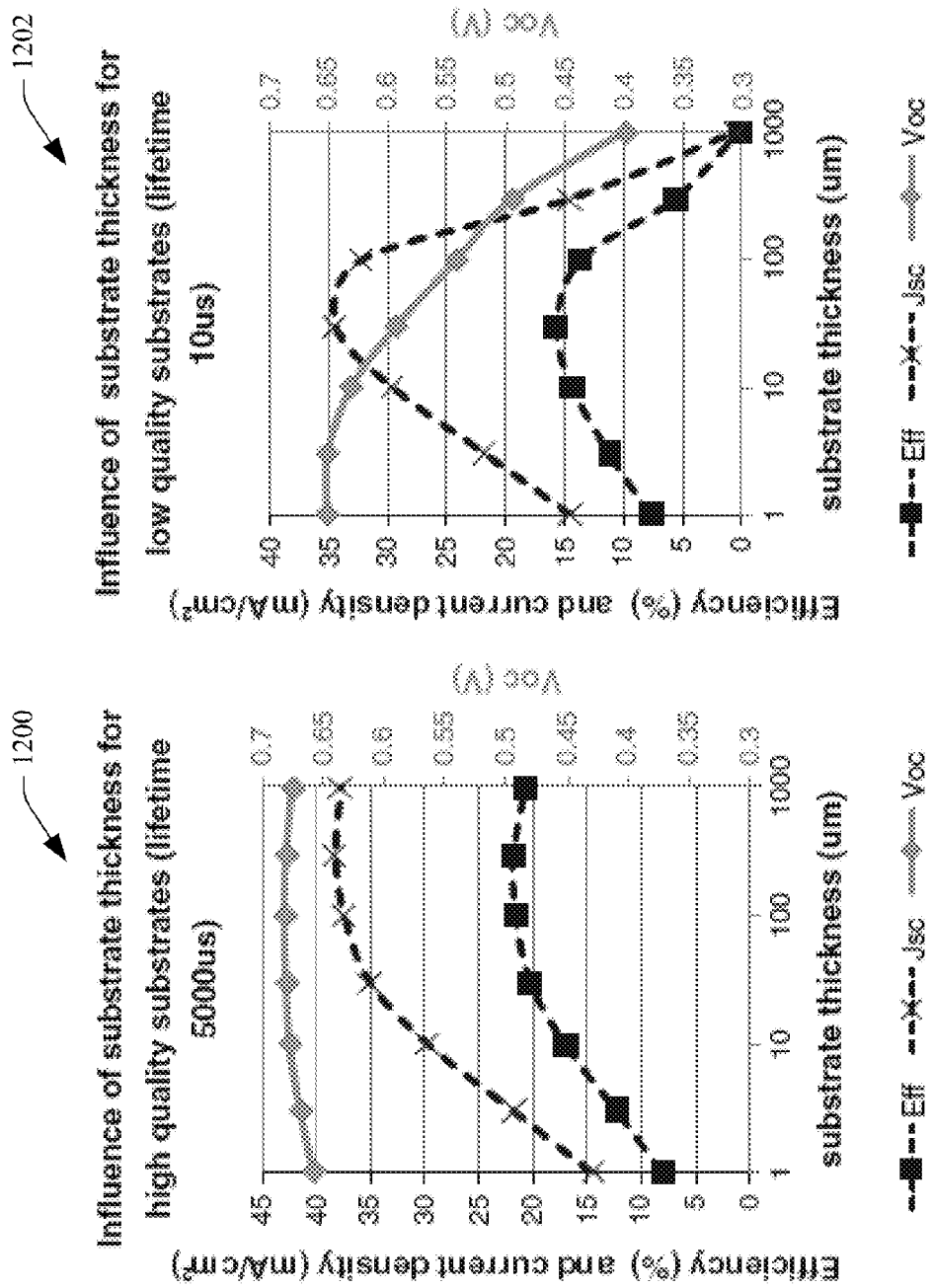
FIG. 12 is a set of graphs depicting influence of substrate thickness on various parameters of an MEPV cell.

With reference to FIG. 12, graphs 1200 and 1202 illustrating the influence of substrate thickness for high and low quality cells on efficiency, current density, and open circuit voltage of a MEPV cell are shown. FIG. 12 displays the influence of the substrate thickness for two cases: one using a high quality substrate with a SRH lifetime of 10 μs. As the thickness of the high lifetime substrate increased, the voltage and current increased with a behavior of diminished returns. For >300 μm substrates, the efficiency was reduced as the thickness was increased. For the low quality substrate, the efficiency increased as the thickness increased, peaked around 30 μm, and decreased for thicknesses of 100 μm and greater. Therefore, low quality substrates can be utilized to make high efficiency cells if the substrates are thin. It is shown in the graph that there is a tradeoff between absorption and bulk recombination (lifetime or diffusion length). It has been suggested in the literature that a ratio of 2.3 between the carrier diffusion length and the wafer thickness should be used for optimum electronic confinement.

Figure 13:
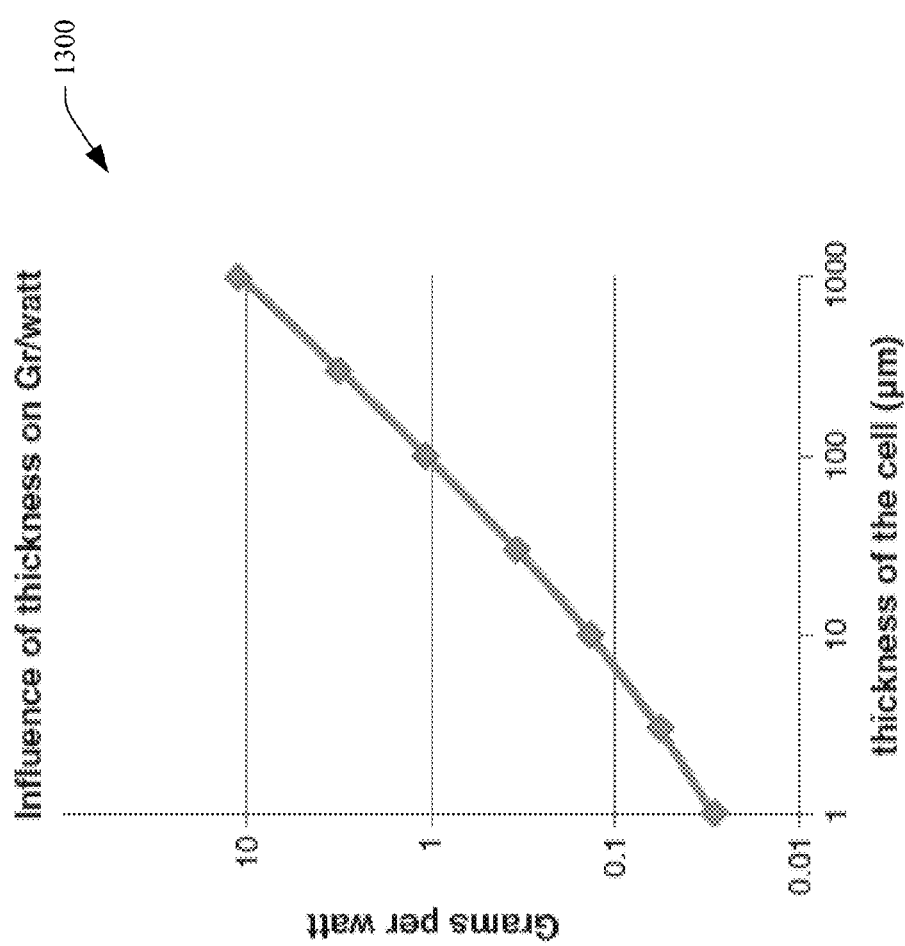
FIG. 13 is a graph depicting influence of substrate thickness on grams/watt-peak of an MEPV cell.

The behaviors were caused by the increased bulk recombination as the substrate was thickened because generated carriers travel through the thickness of the wafer to find the contacts. The effect is more obvious for shorter lifetimes than for longer lifetimes. The amount of material needed to obtain a certain amount of power is often represented as the grams per watt-peak. Turning to FIG. 13, a graph 1300 illustrating the grams per watt-peak as a function of substrate thickness is shown. The amount of material needed per watt-peak decreased drastically as the cells were made thinner. For solar cells, the efficiency does not diminish linearly with the thickness, whereas the amount of material does diminish linearly. Material costs are a relatively large portion of total module cost; therefore, reducing material use, while keeping efficiencies high, is a key to achieving grid parity. Producing ultrathin cells is a means to reducing the amount of material used. FIG. 13 illustrates that values as low as 0.3 g watt$^{-1}$ can be achieved (and perhaps even lower) with ultrathin wafers.

Influence of Light Concentration on Cells

Light concentration on solar cells has proven to be beneficial. The record for solar cell conversion efficiency in silicon was set using concentrated light. Simulations directed towards ascertaining influence of light concentration on MEPV cells were conducted on two devices, one with a width of 20 μm and contact separation of 10 μm, and a second with a width of 200 μm and contact separation of 200 μm. For both devices, the substrate was 20 μm thick, with an implantation width of 1 μm and a contact size of 0.5 μm. The implant energies were 45 keV for boron and 120 keV for phosphorus with a dose of $1\times10^{15}$ $cm^{-2}$ for both dopants. The optical concentration was varied (number of suns) in values of 0.1, 1, 10, 100, and 200. Experimental prototypes were tested in concentrations of light below 1 sun.

Figure 14:
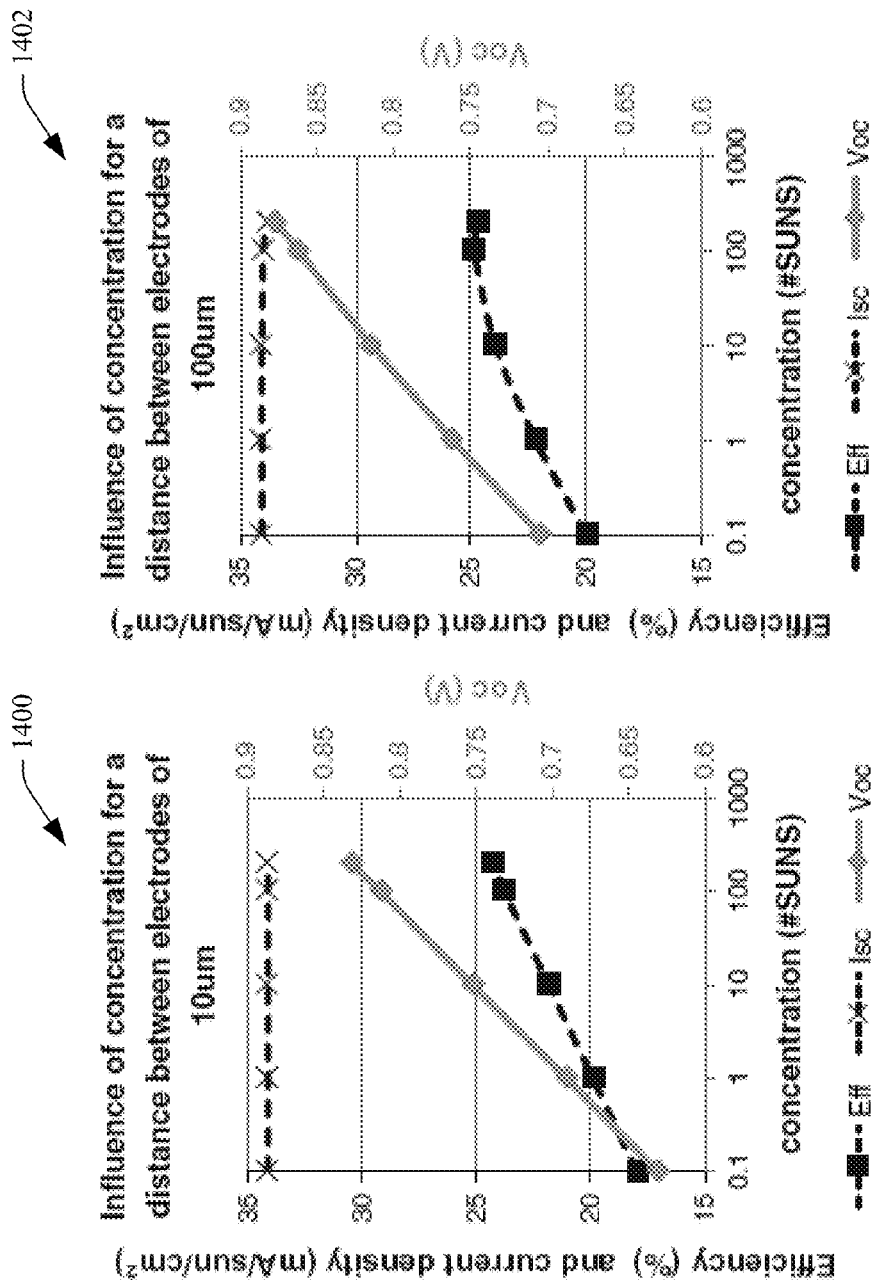
FIG. 14 is a set of graphs depicting influence of light concentration on various parameters of an MEPV cell.

FIG. 14 comprises graphs 1400 and 1402 that illustrate influence of light concentration on MEPV cell performance. FIG. 14 illustrates how the number of suns applied to the solar cell has a beneficial effect on the performance of the cell. As the sun intensity increased, the efficiency increased as well. For the case of small separation, the efficiency did not peak at 200 suns in comparison with the peaked efficiency at 100 suns for the model with more separate contacts.

Influence of Surface Recombination Velocity

Surface recombination and passivation has a strong effect on the performance of MEPV cells due to the proximity of surfaces to active regions of the device. Unpassivated atoms at surfaces have incomplete bonds that act as carrier traps. SRV measures the quality of surface passivation in which slower velocities indicate improved passivation. An increase in SRV generally corresponds to a decrease in cell efficiency, short-circuit current, and open-circuit voltage, which start from an asymptotic maximum, and approach 0 for high values of SRV.

Figure 15:
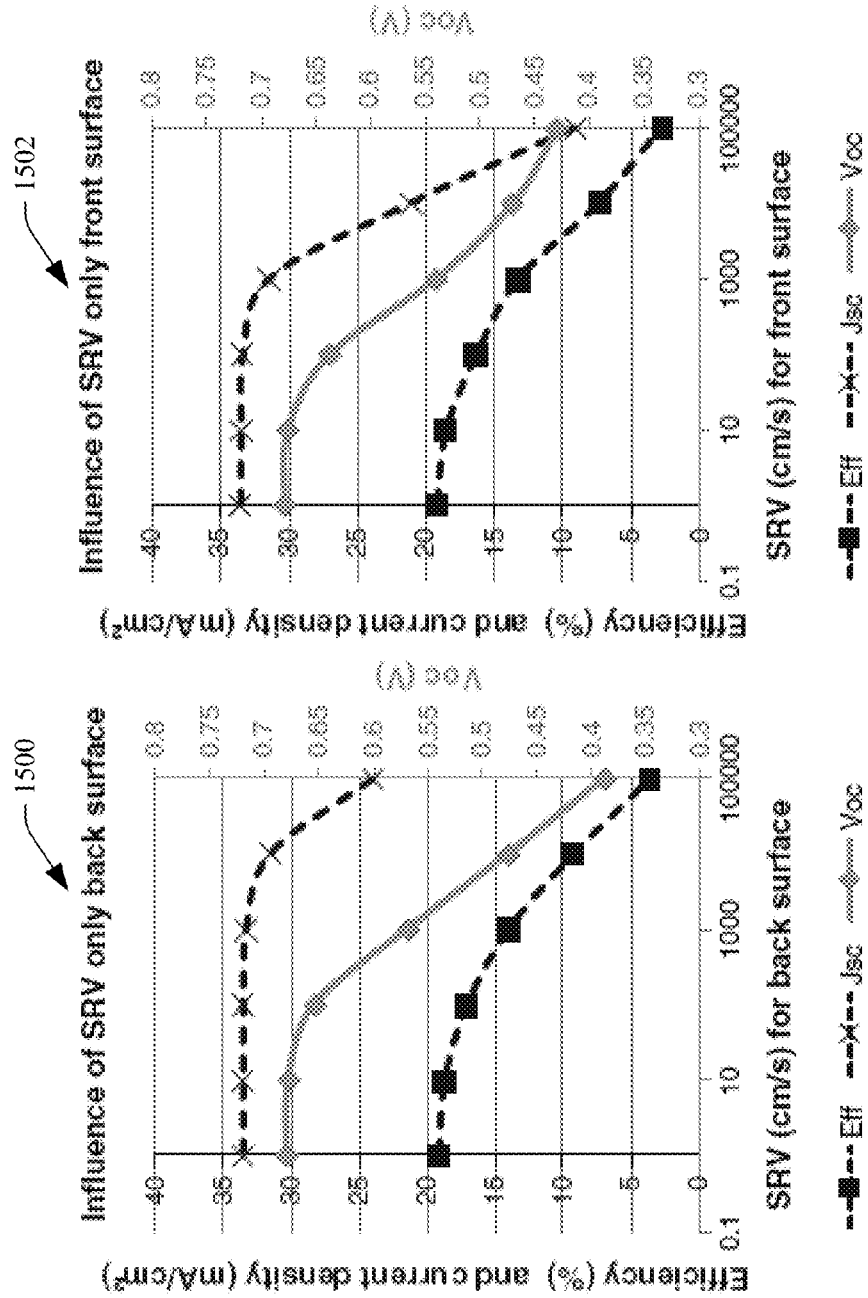
FIGS. 15 and 16 include graphs depicting influence of surface recombination velocity on various parameters of an MEPV cell.
Figure 16:
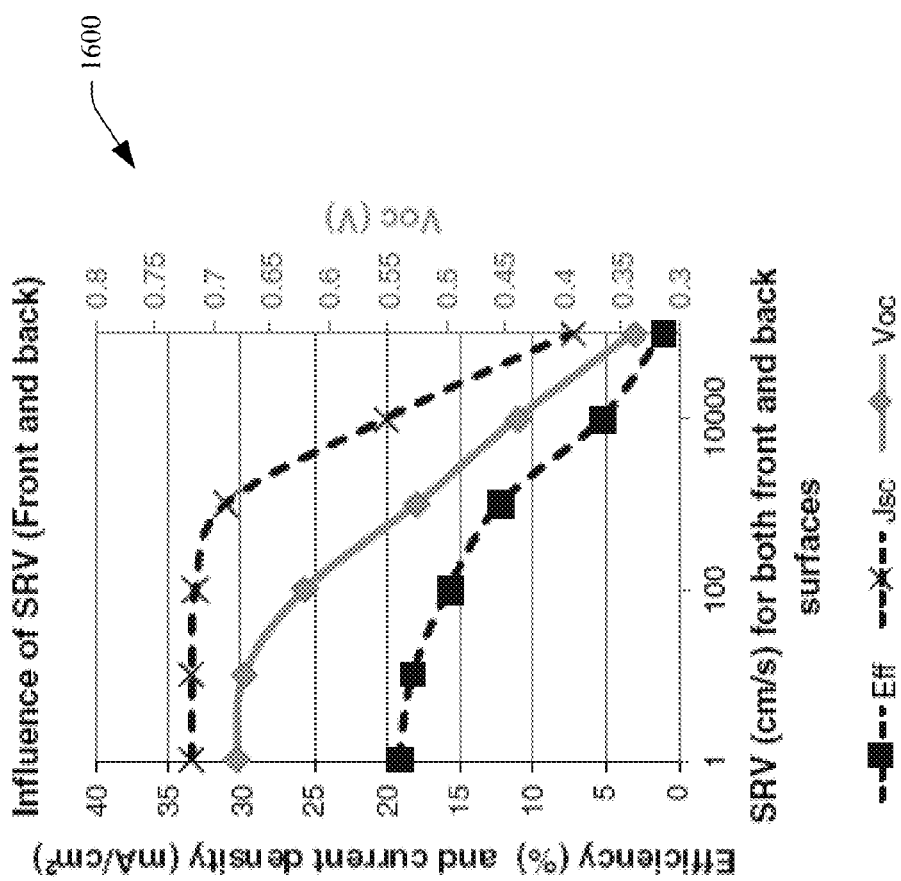

With reference to FIGS. 15 and 16, graphs 1500, 1502, and 1600 illustrating influence of SRV on MEPV cell performance are shown. Several different devices were simulated. The first case (graph 1500) had a fixed back SRV equal to zero whereas the front SRV varied. The second case (graph 1502) expressed the opposite: it had a fixed front SRV equal to zero and a back SRV that varied. The third case (graph 1600) had an SRV that varied in front and back surfaces. In all cases, a 42-μm-wide and 20-μm-thick substrate with a contact separation of 21 μm was used. The implantation width was 8 μm and the contact size was 3 μm. The implant energies were 45 keV for boron and 120 keV for phosphorus with a dose of $1\times10^{15}$ $cm^{-2}$ for both dopants. The surface recombination was varied from 10 to $10^6$ cm s$^{-1}$ incrementing one order of magnitude between each point in the graph.

As predicted, surface recombination has a crucial role in the performance of the cell. Surface recombination at the front degrades the performance faster than having the same amount of surface recombination in the back. When top and bottom surface recombination is present, the same design of contacts, implantations, and geometrical values can yield efficiencies from less than 1% for high SRVs to 20% for low SRVs.

The simulations referenced above were conducted through utilization of a computer software program that uses numerical methods. Two main tools were employed to simulate the process and electronic behavior of the device: TSUPREM-r and Medici, both by SYNOPSYS®. The code programmed in Medici simultaneously solves three coupled nonlinear partial differential equations at every position in the simulated device: Poisson's equation, the continuity equation for holes, and the continuity equation for electrons. Such equations are discretized and solved with boundary conditions for each point in the mesh. Because such equations are coupled and non-linear, a numerical method can be used to perform the simulations.

Figure 17:
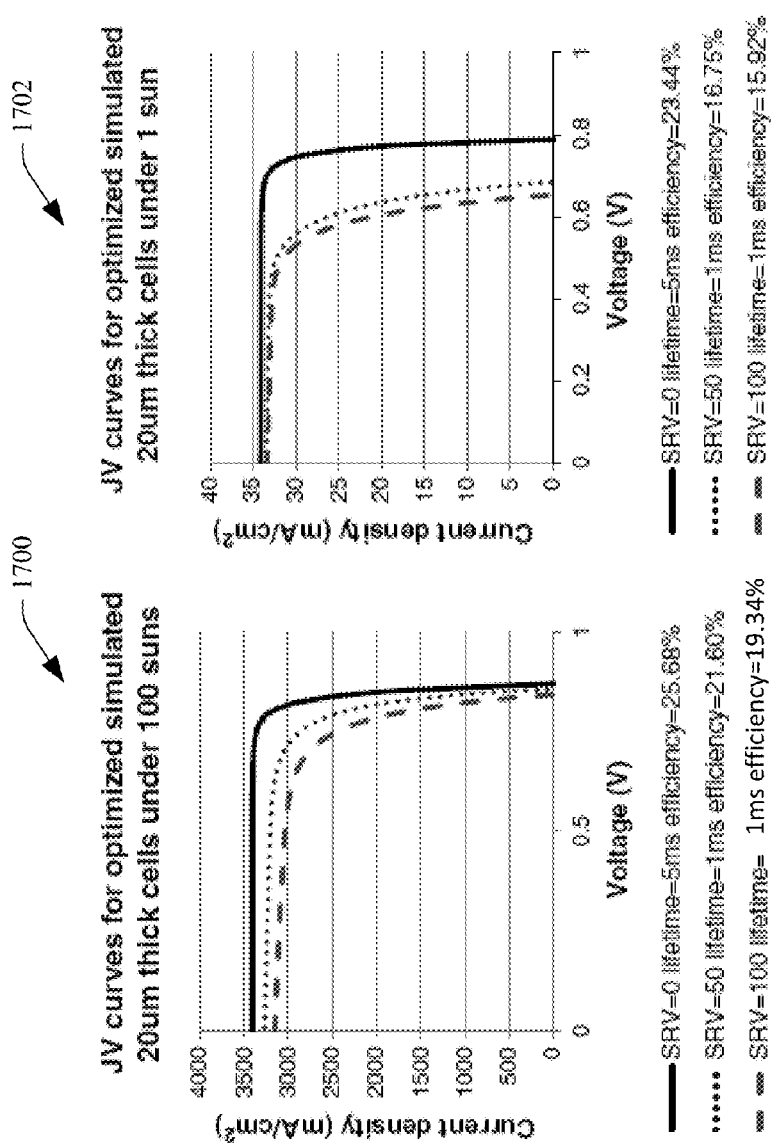
FIG. 17 depicts graphs corresponding to an optimized MEPV cell.

Now referring to FIG. 17, graphs 1700 and 1702 of the simulated performance of MEPV cells optimized for cell efficiency are illustrated.

The above described influences and considerations can be used so as to, for any given restrictions on parameters of the MEPV cell, compute values for the plurality of parameters of the MEPV cell to be incorporated into a design optimized with respect to a selected parameter. In one example, in a design wherein cell efficiency is the selected parameter, parameters may be restricted as follows: high carrier lifetime, high light concentration, high dosage, low energy, small contact size, a contact separation of −200 μm, an implant coverage percentage of 3%, and a substrate thickness of 20 μm. Based on the foregoing, MEPV cells may be designed so as to have a theoretical cell efficiency of as much as 25.68%.

Figure 18B:
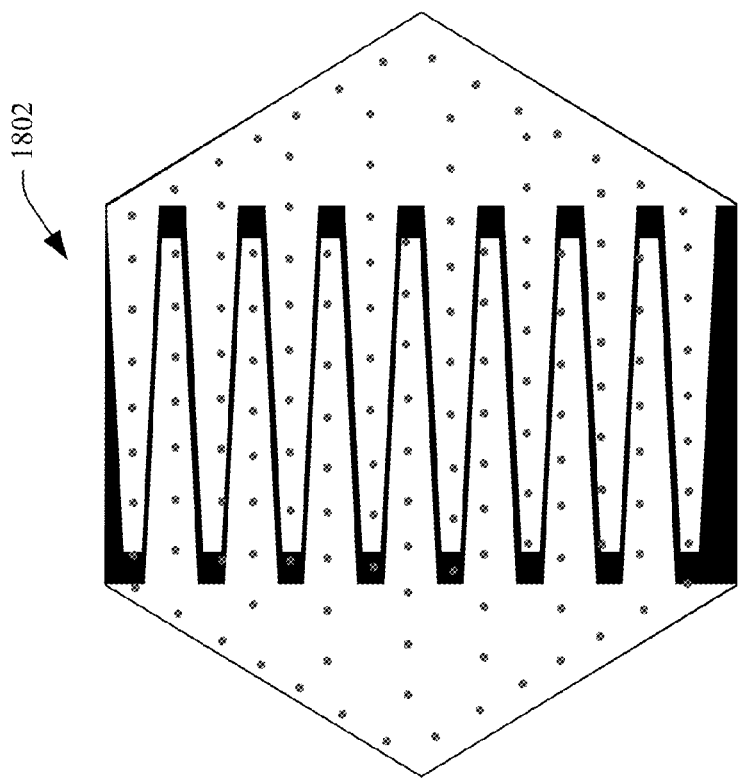
FIGS. 18A and 18B illustrate exemplary portions of an optimized MEPV cell.
Figure 18A:
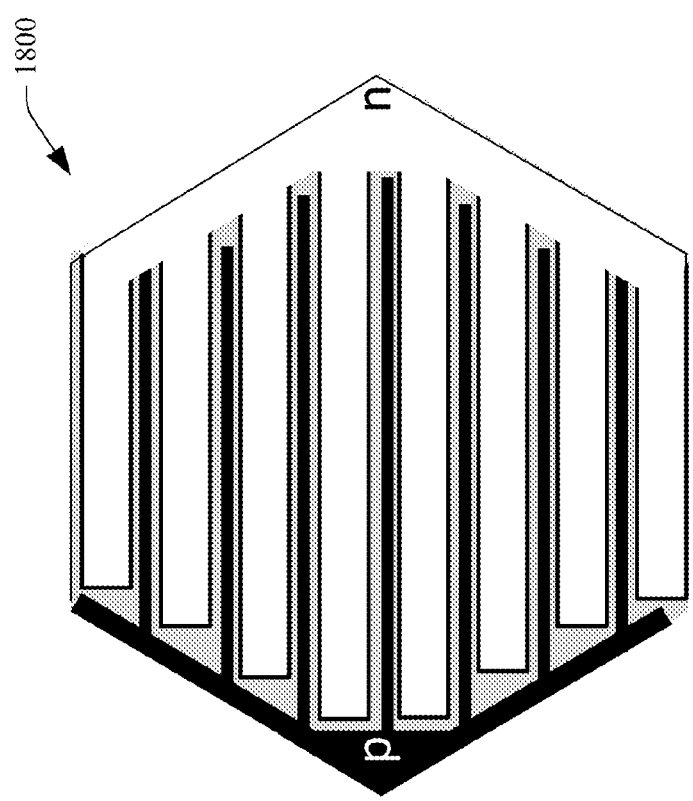

Referring to FIGS. 18A and 18B, layers 1800 and 1802 of an exemplary MEPV cell that is optimized by way of simulation with respect to a particular scenario is illustrated. It can be noted by viewing FIGS. 18A and 18B that the MEPV cell includes interdigitated fingers that are trapezoidal in shape. The MEPV cell can be built using a relatively inexpensive substrate, such as Si. For instance, the substrate can have a relatively low lifetime and a relatively simple passivation method compared to other potential substrates. The implantation area is shown as covering a majority of the back of the cell, and create a back surface field that enhances passivation. Specifically, the implantation area is shown as being an interdigitated structure, where fingers are positioned proximate to one another (e.g., 10 μm or less). As shown in FIG. 18, the n-doped area is larger than the p-area—e.g., more than eight times larger when the wafer is a p-type wafer. The reverse is true when the wafer is an n-type wafer (e.g., the p-doped area is more than eight times larger). Furthermore, it is to be understood that a dielectric layer can be disposed between the semiconductor material and the metal, possibly surrounding the whole cell. The alternate fingers of metal are as thin as the separation between different implanted areas and are as close as possible without touching between fingers of different polarity. Still further, an amount of metal that touches the semiconductor is as small as possible—such as on the order of less than 0.1 percent. Gaps between fingers or the area not covered with metal is desirably relatively small to provide maximum back reflection of photons. Additionally, fingers can be thinner towards the end of the cell and thicker towards the base of the cell.

Referring collectively to FIGS. 3 and 4, another description of an optimized solar cell with respect to another particular scenario is described. In such scenario, a high-quality substrate with high lifetime and an optimum passivation layer is employed. As shown in FIG. 3, the implantation area is minimum in the back of the cell, which reduces carrier recombination in the contacts. Since the passivation is optimum, the creation of a back surface field is not necessary. The implantation area is an alternate succession of small areas of different dopant (p and n), where different polarity areas are as far from each with other as possible but less than the measured carrier diffusion length in the passivated wafer or silicon. The n doped area is greater than eight times bigger than the p covered area for n-type wafers, and the p area is over eight times bigger than the n covered area for p-type materials. A dielectric can be disposed between the semiconductor and the metal and possibly surrounding the whole cell. The alternate fingers of metal are as wide as the distance between centers of doped areas are and are as close as possible without touching between fingers of different polarity. Additionally, an amount of metal that touches the semiconductor is as small as the process allows (e.g., <0.1% may be desirable). Gaps between fingers or the area not covered with metal can be as small as possible to provide maximum back reflection of photons. Additionally, the fingers can be thinner towards the end and thicker towards the base.

Figure 19:
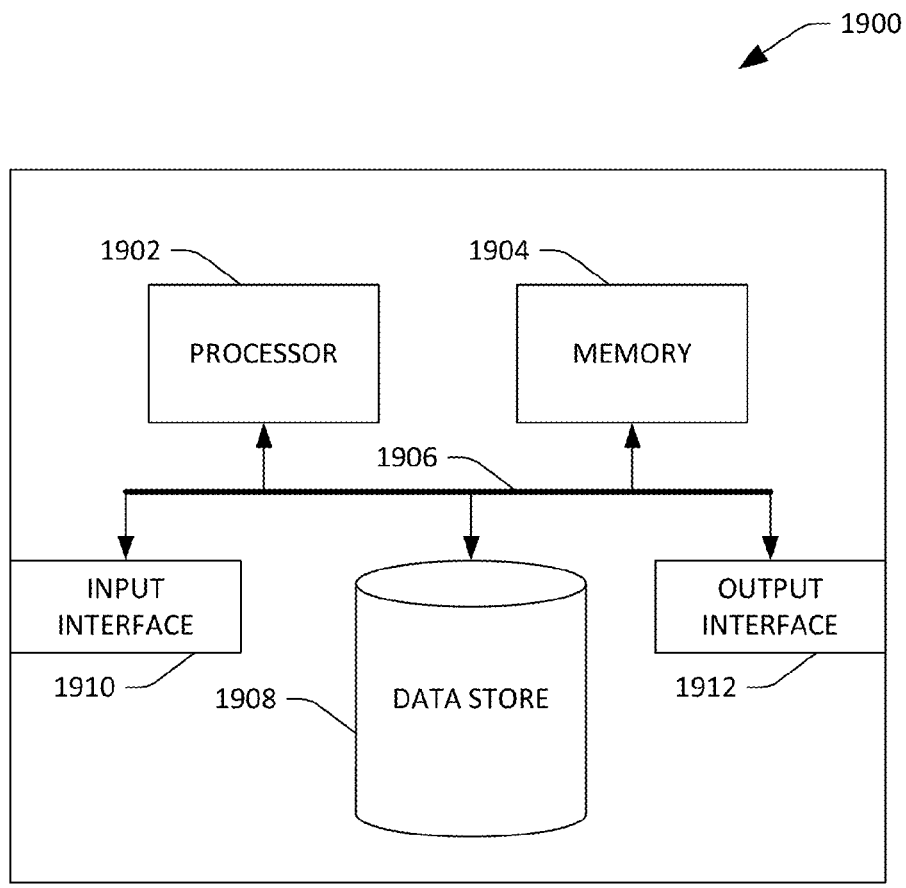
FIG. 19 is an exemplary computing device.

Now referring to FIG. 19, a high-level illustration of an exemplary computing device 1900 that can be used in accordance with the systems and methodologies disclosed herein is illustrated. For instance, the computing device 1900 may be used in a system that supports designing an MEPV cell. In another example, at least a portion of the computing device 1900 may be used in a system that supports facilitating the design of an MEPV cell. The computing device 1900 includes at least one processor 1902 that executes instructions that are stored in a memory 1904. The memory 1904 may be or include RAM, ROM, EEPROM, Flash memory, or other suitable memory. The instructions may be, for instance, instructions for implementing functionality described as being carried out by one or more components discussed above or instructions for implementing one or more of the methods described above. The processor 1902 may access the memory 1904 by way of a system bus 1906. In addition to storing executable instructions, the memory 1904 may also store steps for facilitating the design of an MEPV cell, relationships and influences by and between parameters and characteristics of an MEPV cell, parameters and characteristics of an MEPV cell, or designs for an MEPV cell.

The computing device 1900 additionally includes a data store 1908 that is accessible by the processor 1902 by way of the system bus 1906. The data store may be or include any suitable computer-readable storage, including a hard disk, memory, etc. The data store 1908 may include executable instructions, parameter values, parameter restrictions, etc. The computing device 1900 also includes an input interface 1910 that allows external devices to communicate with the computing device 1900. For instance, the input interface 1910 may be used to receive instructions from an external computer device, from a user, etc. The computing device 1900 also includes an output interface 1912 that interfaces the computing device 1900 with one or more external devices. For example, the computing device 1900 may display text, images, etc. by way of the output interface 1912.

Additionally, while illustrated as a single system, it is to be understood that the computing device 1900 may be a distributed system. Thus, for instance, several devices may be in communication by way of a network connection and may collectively perform tasks described as being performed by the computing device 1900.

It is noted that several examples have been provided for purposes of explanation. These examples are not to be construed as limiting the hereto-appended claims. Additionally, it may be recognized that the examples provided herein may be permutated while still falling under the scope of the claims.

What is claimed is:

1. A system that facilitates designing a microsystems-enabled photovoltaic (MEPV) cell, the system comprising:
   a processor; and a computer readable data storage device that comprises a plurality of components that are executed by the processor, the plurality of components comprising:

a data repository in which is embodied a list of selectable parameters of an MEPV cell, each said parameter being indicative of a physical property or an operational property of the MEPV cell;

a stored model of the MEPV cell in which: interrelationships among the parameters of the MEPV cell are represented; at least one generalized design of the MEPV cell is embodied; and the generalized design includes specifications of at least a substrate layer, doped n-type and p-type regions of the substrate layer, and a contact layer that includes backside electrical contacts;

a receiver component that receives a user-designated constraint on one or more of the selectable parameters, which are thereby designated as constrained parameters, and that further receives a selection of one or more other selectable parameters relative to which the MEPV cell is to be optimized, whereby such other parameters are designated as objective parameters; and an analysis component that computes respective values for a plurality of parameters of the MEPV cell such that the MEPV cell is optimized with respect to the one or more objective parameters, wherein the analysis component computes the respective values for a subset of the selectable parameters excluding the objective parameters, based on the stored model of the MEPV cell and subject to the user-designated constraint;

wherein the interrelationships among the parameters of the MEPV cell that are represented in the stored model include an interdependence among cell efficiency, SRH lifetime, and separation between collection electrodes within a given cell whereby cell efficiency rises with electrode separation in a range of SRH lifetimes and falls with substrate thickness in a different range of SRH lifetimes;

wherein said interrelationships further include an interdependence among cell efficiency, SRH lifetime, and substrate thickness whereby cell efficiency rises with substrate thickness in some regimes of substrate thickness and SRH lifetime and falls with substrate thickness in other said regimes; and wherein cell efficiency, SRH lifetime, separation between collection electrodes within a given cell, and substrate thickness are included on the list of selectable parameters.

2. The system of claim 1, wherein the list of selectable parameters comprises at least one of a size, a dosage, and an energy for an implant profile of the MEPV cell.

3. The system of claim 1, wherein the list of selectable parameters comprises a size of the backside contacts of the MEPV cell.

4. The system of claim 1, wherein the efficiency of the MEPV cell is an objective parameter.

5. The system of claim 1, wherein:

the interrelationships among the parameters of the MEPV cell that are represented in the stored model further include an interdependence among current density, surface recombination velocity, and percentage of cell area covered with implants whereby current density rises with increasing implant coverage for some ranges of surface recombination velocity but not for other ranges of surface recombination velocity; and current density, surface recombination velocity, and percentage of cell area covered with implants are included on the list of selectable parameters.

6. The system of claim 1, wherein:

the interrelationships among the parameters of the MEPV cell that are represented in the stored model further include an interdependence among efficiency, surface recombination velocity, and ratio of p-type to n-type implanted areas of the substrate whereby efficiency rises with increasing implant ratio for some ranges of surface recombination velocity and falls with increasing implant ratio for other ranges of surface recombination velocity; and surface recombination velocity and percentage of cell area covered with implants are included on the list of selectable parameters.

7. The system of claim 1, wherein:

the interrelationships among the parameters of the MEPV cell that are represented in the stored model further include an interdependence among efficiency, separation between collection electrodes within a given cell, and solar concentration factor whereby efficiency rises with increasing solar concentration for some ranges of electrode separation and rises only until a peak value is reached for other ranges of electrode separation; and solar concentration factor is included on the list of selectable parameters.

* * * * *